United States Patent [19] [11] 3,880,675
Tarui et al. [45] Apr. 29, 1975

[54] METHOD FOR FABRICATION OF LATERAL TRANSISTOR

[75] Inventors: Yasuo Tarui, Higashi-Kurume; Yoshio Komiya, Tanashi; Hiroo Teshima, Mitaka all of Tokyo,

[73] Assignee: Agency of Industrial Science & Technology, Tokyo, Japan

[22] Filed: Sept. 18, 1972

[21] Appl. No.: 289,777

[30] Foreign Application Priority Data

Sept. 18, 1971 Japan ............................ 46-72167

[52] U.S. Cl. ............................ 148/1.5; 148/191
[51] Int. Cl. ............................ H01l 7/54
[58] Field of Search ............................ 148/1.5, 191

[56] References Cited

UNITED STATES PATENTS

| | | | |
|---|---|---|---|
| 3,595,716 | 7/1971 | Kerr et al. | 148/1.5 X |
| 3,704,177 | 11/1972 | Beale | 148/1.5 |
| 3,718,502 | 2/1973 | Gibbons | 148/191 X |
| 3,734,787 | 5/1973 | Dhaka et al. | 148/191 X |

OTHER PUBLICATIONS

"Radiation Enhanced Diffusion of Bin Silicon," Nelson et al., App. Phy. Let. Vol. 15, No. 8, 15 Oct. 69, pp. 246-248.

*Primary Examiner*—L. Dewayne Rutledge
*Assistant Examiner*—J. M. Davis

[57] ABSTRACT

A method for fabrication of a lateral transistor is disclosed, which comprises the step of diffusing base impurity by means of the RED method from the same masking hole determining an emitter region on a substrate which includes the emitter region and a collector region on the crystalline main plane thereof.

11 Claims, 29 Drawing Figures

METHOD FOR FABRICATION OF LATERAL TRANSISTOR

This invention relates to a method for fabrication of a lateral transistor.

A considerable part of the innovations in transistor design introduced between the invention of the transistor itself and the advent of the mesa transistor were aimed at improvement of frequency characteristics through reduction of the width of the base region.

As advancements in the technology of impurity diffusion made it possible to sufficiently control base width renewed efforts were next made to control maximum frequency of oscillation (which is a very important figure of merit of transistors to be considered in evaluation of their overall high frequency characteristics) by another factor, that is, the base resistance.

FIG. 1, for example, illustrates a conventional planar transistor which is comprised of a substrate 1 which doubles as collector, emitter region 2, base contact 3, collector-base depletion region 1*a*, internal base resistance 3*a* and external base resistance 3*b*. In this type of transistor, the reduction of both the base width and the internal base resistance is a self-contradictory attempt. In order to reduce the base width and at the same time reduce the internal base resistance, the emitter width S and the emitter-to-base spacing S/2 have to be made sufficiently small. By the following simplified formula of J. M. Early:

$$f_{max} \approx \frac{4 \times 10^6}{S}$$

As is clear from this equation, the maximum frequency of oscillation of a transistor is in inverse proportion to the emitter width S.

Heretofore this emitter width S has been determined by the photo-etching technique, with an accuracy well over 10 times inferior to that of the diffusion technique. The emitter width so determined will be accurate to 1 micron at best and, moreover, the emitter width of this value cannot be controlled efficiently by the photo-etching technique. If, therefore, the length of the base resistance portion in the direction of base current flow corresponding to the aforesaid emitter width is controlled with the accuracy of the diffusion technique, and at the same time if the base resistance is made sufficiently small, the frequency characteristics of the transistor will be improved to a great extent.

As one way to accomplish this, there has been proposed a structure as illustrated schematically in FIG. 2, 1*c* are N type collector portions, 2 an $N^+$ type emitter diffusion layer, 3*a* internal base regions, 3*b* external base regions formed by ion implantation in such a manner that the deeper portion of the region has more dense impurity, 3*c* a $P^+$ type substrate adapted to further reduce the base resistance and 4 a mask for the ion implantation and diffusion.

In this construction, the use of the ion-implantation technique for introduction of base impurity ensures that the density of impurity in the lower portion of the base region is more dense than that in the upper portion thereof and prevents unnecessary injection of minority carrier electrons into the lower base portion under the emitter and furthermore reduces the base resistance. On the other hand, since the effective base width of the main base region is determined by the difference W between the diffusion lengths of emitter impurity and of base impurity, which are subsequently introduced at the same position (i.e. through the same mask 4) into the substrate, a base width of submicron scale can be realized uniformly in mass production without much difficulty. Moreover, the vertical length of the portion 3a corresponding to the internal base resistance is determined by the diffusion depth of the emitter impurity.

According to the above mentioned method, there can be obtained transistors having desirable high frequency characteristics which could not previously be realized. However, the ion implantation method has various demerits which manifest themselves in the designing and fabrication of such transistors. Firstly, in order to implant a sufficient volume of base impurity to a sufficient depth in the substrate, there is required a very high acceleration voltage and a long ion implantation time.

Secondly, since the injection of ions of a single energy range tends to make the surface density of impurity too low, the design and fabrication of such transistors requires very complicated control and regulation.

The present invention is directed to a method for fabricating ultra high frequency transistors, which has none of the demerits inherent to the prior method. According to the present invention, a method for fabricating a lateral transistor is realized by determining the basic structure of the lateral transistor in such manner that the length of the portion corresponding to the internal base resistance 3*a* is determined by the emitter diffusion length and the width of the base is determined by the difference in the lengths of the double-diffusions of the emitter and the base made from a common diffusion hole. Therefore this transistor structure is not impaired by the lower precision of photo-etching. Moreover the base portion is a $p^+$ base region under the emitter into which there is hardly any injection of minority carriers.

Consequently the present method gives remarkably increased freedom of lateral transistor and eliminates the impossibility of reducing both the base width and the base resistance which was inherent in conventional transistors.

The above and other objects and advantages of this invention will become apparent from reading the following description of preferred embodiments of the present invention with reference to the accompanying drawings, in which.

The essence of the present method lies in the utilization of selective RED dispersion in order to obtain an ultra high frequency lateral transistor, where the term "RED (Radiation Enhanced Diffusion)" means a technique for redistributing previously existing impurities in a semiconductor or newly introducing impurities into the semiconductor by subjecting the surface thereof to irradiation at high voltage with ions such as $H^+$ or $He^+$, that is, by utilizing the fact that the diffusion coefficiencies of the impurities which have been distributed in the semiconductor prior to irradiation or are introduced into the semiconductor during irradiation are increased due to the crystal imperfections arising in the semiconductor due to irradiation.

Figure 1:
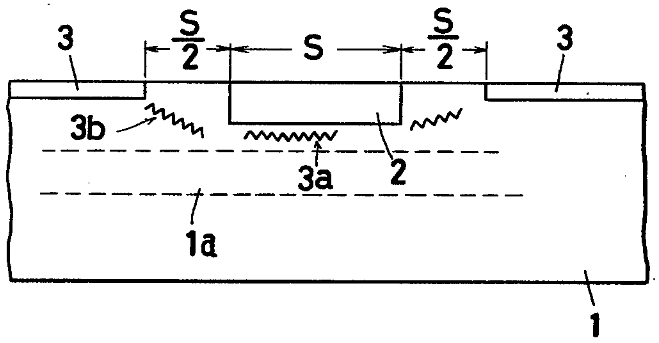
FIG. 1 PRIOR ART
FIG. 1 (already explained) shows a cross-section of the basic construction of the conventional planar transistor.
Figure 2:
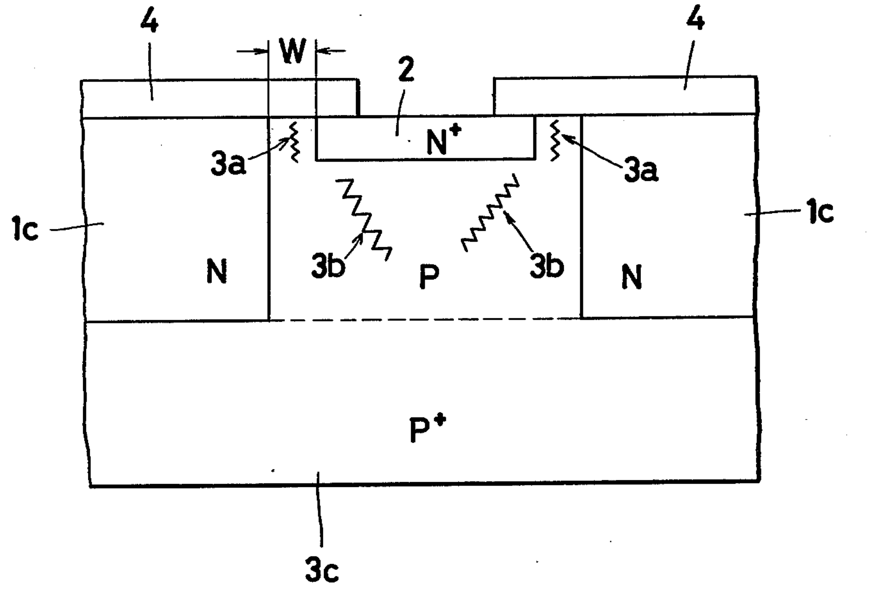
FIG. 2 PRIOR ART
FIG. 2 (already explained) shows a cross-section of the basic construction of a lateral transistor proposed to overcome the demerits of the conventional transistor shown in FIG. 1.
Figure 3:
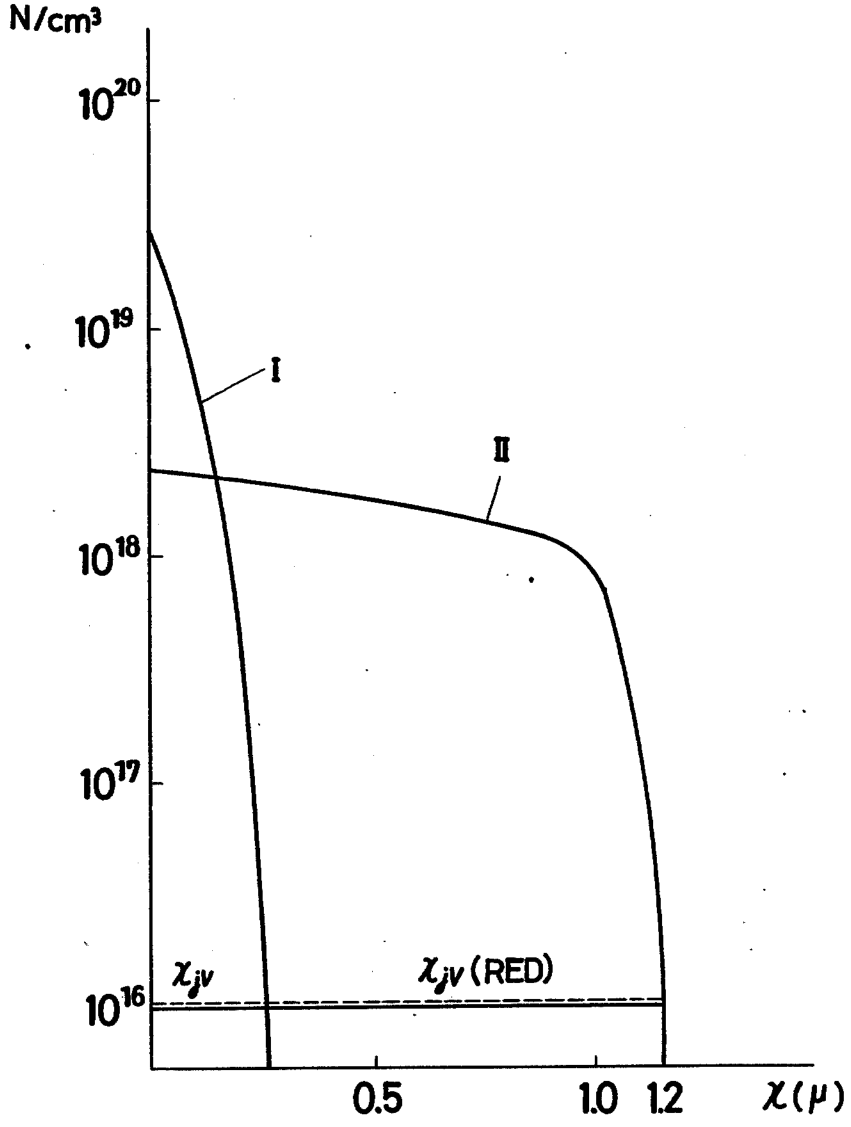
FIG. 3 is an explanatory graph illustrating the effect of RED (Radiation Enhanced Diffusion)

The effect of RED itself on a semiconductor substrate can normally be sufficiently obtained at a substrate temperature on the order of 600°– 900°C. The effect of re-distribution of impurities due to conventional thermal diffusion at such temperature is, on the contrary, very small and negligible. FIG. 3 shows a comparison of the impurity distributions achieved by thermal diffusion and RED. In FIG. 3, curve I shows the impurity distribution obtained by thermal diffusion with a boron doped oxide at 1100°C for about 5 minutes and curve II shows the distribution obtained by irradiating a substrate having initially a thermally diffused shallow junction $x_{jV}$ (the suffix V represents the vertical direction) formed as shown in the curve I at the temperature of 800°C, with $H^+$ or $He^+$ ions etc. having an acceleration voltage of about 80 – 150 KV. From FIG. 3, it is clear from the distribution shown by curve II that the impurities were redistributed to sufficient depth into a substrate which had the initial distribution in the vertical direction shown by curve I.

Figure 4:
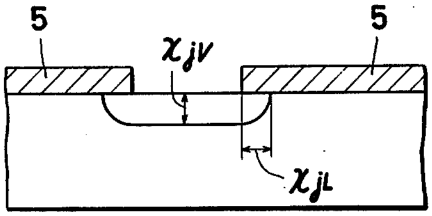
FIGS. 4–5 illustrate the difference in diffusion front between the diffusions performed by the conventional selective diffusion and the RED method.
Figure 5:
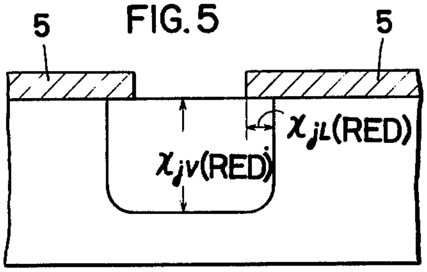

Accordingly, when a single thermal diffusion is performed selectively as shown in FIG. 4, the relation between the depth of junction $x_{jL}$ (the suffix L represents the lateral direction) becomes $x_{jL} \sim x_{jL}$, showing that the diffusion length in the vertical direction is substantially the same as that in the lateral direction, where the reference numeral 5 shows a diffusion mask. On the contrary, when a further enhanced diffusion is performed by the RED method through the mask 5, the above relation becomes $X_{jV}$ (RED) > $x_{jL}$ (RED) as shown in FIG. 5 and thus it is possible to provide a considerable difference in diffusion length between the two directions. When RED is performed in the ordinary manner, it is also possible to make the relation become $x_{jV}$ (RED) $\geqq$ 1.5 $x_{jL}$ (RED).

Since, in the RED method, the variation in diffusion length due to ion radiation is greater for ions of smaller mass, it is possible to increase the range of diffusion of base impurities by several times that which can be achieved by ion implantation if proton etc. is used as the radiating ion. On the other hand, since the impurity diffusion enhanced by the increase in diffusion coefficiency depends upon the amount of impurity previously introduced in the substrate by an impurity predeposition and the time required to introduce the ion, the RED method can be performed in a shorter time than the ion implantation method even when an equal amount of impurities are introduced.

The features of the RED method are essentially as above described and an example of the method for fabricating a ultra high frequency lateral transistor according to the present invention which utilizes the above described features of the RED method will be described with reference to FIGS. 6–11 and 12–23.

Figure 6:
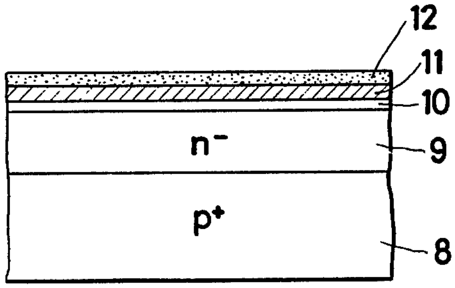
FIGS. 6–11 illustrate one embodiment of the fabrication method for lateral transistors according to the present invention.

FIG. 6 shows an embodiment where the base contact is derived directly from a lower substrate of $P^+$ type. This embodiment comprises a first step of attaching a thermally oxidized $SiO_2$ layer 10 the thickness of which is 200 – 500 A on an epitaxial $N^-$ layer 9 provided on one surface of the $P^+$ substrate 8, a second step of attaching an insulating film 11 of such as $Al_2O_3$ the etchant for which is different from that for $SiO_2$ on the $SiO_2$ layer and a step of attaching by the CVD method a polysilicon 12 having thickness on the order of 1 $\mu$ which is used to provide silicon gates on the film 11, as shown in FIG. 6.

Figure 7:
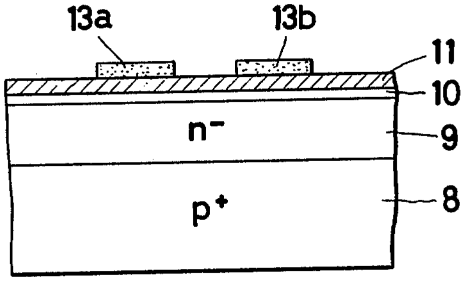

Then, as shown in FIG. 7, all of the poly-silicon 12, except portions corresponding to silicon gate portions 13*a* and 13*b* on the insulating film 11, is removed by photo-etching.

Figure 8:
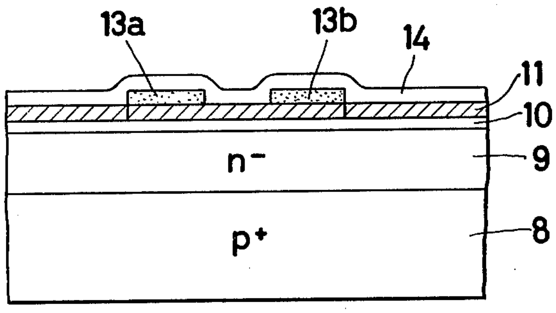

After the partial removal of the poly-silicon 12, an insulating film 14 of $SiO_2$ is provided thereon by the CVD method, as shown in FIG. 8.

Figure 9:
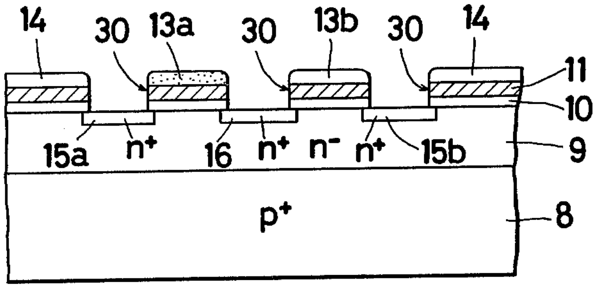

Taking advantage of the fact that the etchant for the insulating film 14 is different from that for the silicon gates 13*a* and 13*b* and the insulating film 11, holes 30 are then formed for diffusion purpose, as shown in FIG. 9, by etching with a suitable mask, and a collector 15*a* and 15*b* and an emitter 16 are then formed by performing an $N^+$ diffusion using As or P etc. through the diffusion holes 30.

Figure 10:
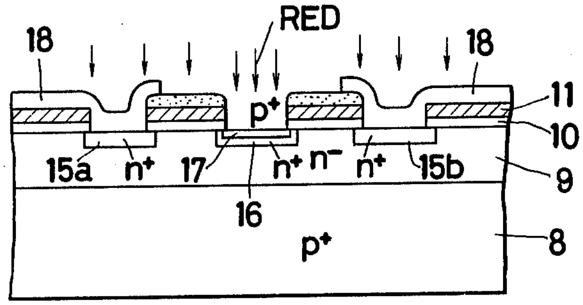

Thereafter, a mask 18 of thick $SiO_2$ is deposited by the CVD method on all areas of the surface and photoetched to form a hole including the center hole 30 for emitter diffusion as shown in FIG. 10 and, within the center hole 30, a shallow diffusion region 17 of boron, etc. is formed. Thereafter RED is performed under a high voltage so that the base impurity is introduced into the substrate through the same hole 30 as that used to form the diffused emitter region.

Figure 11:
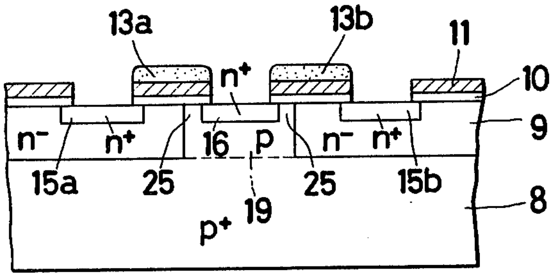

As a result, the base impurity within the shallow diffusion region 17 is further diffused by RED performed at about 600°– 900°C (Thermal diffusion does not occur under such conditions.), and therefore the distribution front of base impurity in the vertical direction is considerably shifted so that the front penetrates the epitaxial layer 9 and brings the base region 19 in contact with the $P^+$ substrate 8 which is at least 1 $\mu$ or more below the epitaxial substrate 8 as shown in FIG. 11. In this embodiment, although the diffusion front shift of the emitter is not so large because the diffusion velocity is low due to the fact that the $N^+$ emitter 16 is made of As or other substance having a very small diffusion constant, the width of the internal base region 25 can be arbitarily controlled to a small distance by heat-treatment utilizing the difference of diffusion constants between the Boron and the Arsenic.

In this manner, the structure shown in such as FIG. 11 can be obtained.

In order to finish this transistor, a few additional steps such as the attaching of $SiO_2$ for forming contact-holes for electrodes by the CVD method using the conventional IC technique and providing electrodes etc., are, of course, required. However, since these steps themselves are well known in this field, detailed description will be unnecessary for those skilled in the art and such is therefore omitted from this specification.

Figure 12:
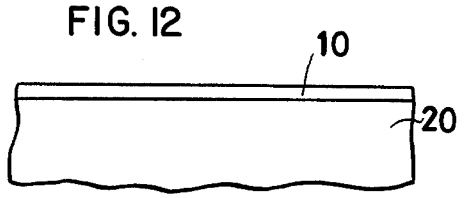
FIGS. 12–29 are flow-charts illustrating other embodiments of the present fabrication method for lateral transistors.

FIGS. 12–23 show another embodiment in which the base contact is, in contrast to that shown in FIGS. 6–11, derived from the upper surface of the structure. To fabricate this transistor, an $SiO_2$ layer 10 for diffusion of base contact is firstly desposed on a substrate 20 as shown in FIG. 12. (The impurity density of the material forming the substrate is made $10^{14}$–$10^{17}$ /cc when the substrate material is N type and is made $\pi$ type when the substrate used is P type).

Figure 13:
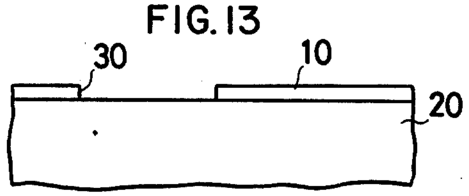

Then, as shown in FIG. 13, a hole 30 for diffusion of the base contact is formed by photo-etching technique.

Figure 14:
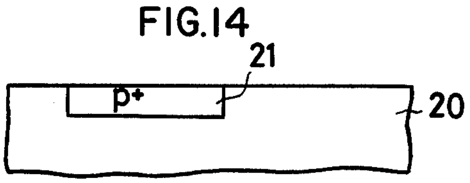

Thereafter, as shown in FIG. 14, a diffusion of boron for producing the base contact is performed so that the $x_j$ of the diffused boron becomes 2–3$\mu$ and the surface concentration Ns becomes $10^{19}/cm^3$, to thereby form a $P^+$ diffused region 21. After this step, the layer 10 is removed by etching.

Figure 15:
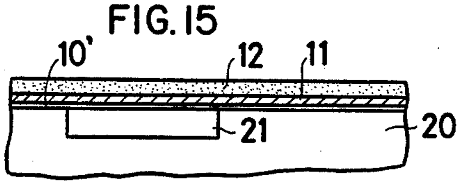

Then, as shown in FIG. 15, a thin $SiO_2$ film 10' whose thickness is about 200 A is provided thereon. On an insulating film 11 such as $Al_2O_3$, a poly-silicon 12 whose thickness is about 0.8 microns is provided.

Figure 16:
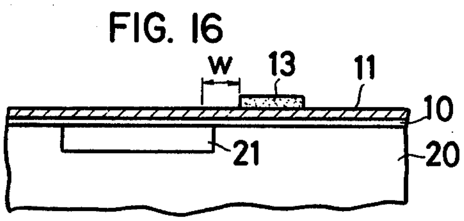
Figure 17:
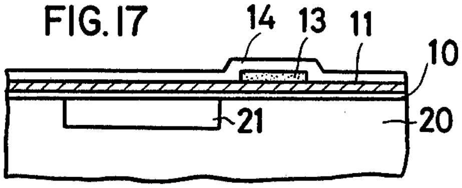
Figure 18:
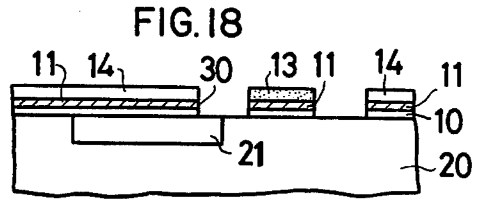

Subsequently, all of the poly-silicon except a silicon gate portion 13 on the insulating film 11 is removed by photo-etching, as shown in FIG. 16. In this embodiment, the position of the portion 13 is separated from the base contact 21 by W which is about 3 microns ($W \approx 3\mu$).

Figure 22:
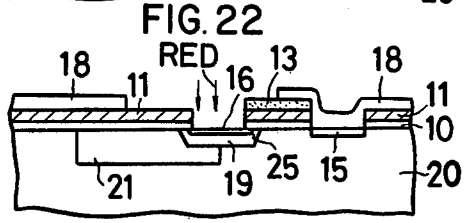
Figure 23:
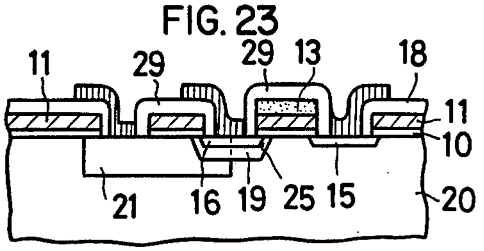

The subsequent steps are the same as those described with respect to FIGS. 8 to 11, that is, providing a $SiO_2$ insulating film 14 (FIG. 17), forming a collector 15 and an emitter 16 using Arsenic doped oxide 23 through a hole 30 for diffusion purpose (FIGS. 18 and 19), forming a shallow base diffused region 17 using boron doped oxide 24 through a mask 18 having a base diffusion hole the same as the emitter diffusion hole (FIGS. 20 and 21) and thereafter forming a base region 19 by the RED method. In this manner, the structure shown in FIG. 22 can be obtained. Thereafter, by photo-etching a thick $SiO_2$ layer 29 provided by the CVD and then by providing wiring, the transistor having the construction shown in FIG. 23 is obtained.

Figure 19:
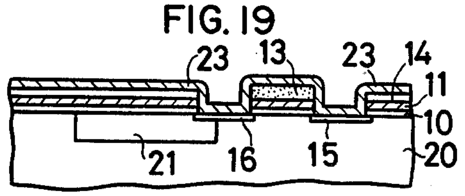
Figure 20:
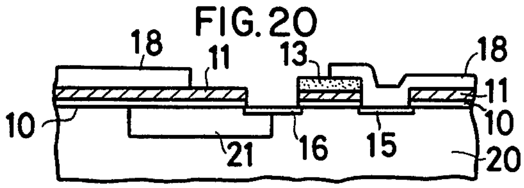
Figure 21:
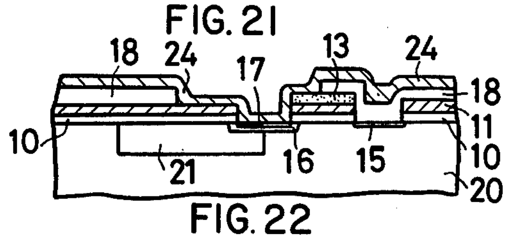

In FIG. 19, the reference numeral 23 shows an oxide doped with such as As to perform the $N^+$ diffusion, 18 in FIG. 20 shows a mask of CVD $SiO_2$ for performing the boron diffusion and RED for the base region which covers the collector portion 15, and 24 in FIG. 21 shows a Boron doped oxide for supplying the base impurity. By using these steps, a thin boron diffused layer 17 is provided in the region 16 and the base region 19 is formed by RED and heat-treatment as shown in FIG. 22, so that the internal base region 25 and the width thereof become controllable.

According to the present method as described above, structures such as shown in FIGS. 11 and 22 can be obtained. However, since the concentration of impurity in the internal base region 25 which is an active portion where substantial minority carrier injection of the base region occurs can be made higher than that of the $N^-$ epitaxial layer 9 or the substrate 20 portion adjacent to the base region 25, the depletion layer is extended mainly into the lateral collector region or the lateral $\pi$ substrate region under the silicon gate to thereby reduce the base width modulation effect known as the Early effect, so that the punchthrough between the emitter 16 and the collector 15, due to D.C. biasing therebetween, can be eliminated. In addition to this, the base region surrounding the emitter 16 is constituted with the portion 25 determined by the difference between the lateral lengths of the double diffusion of the emitter and base and the base region 19 which is deeply extended by RED in vertical direction with a high impurity density such as $5 \times 10^{18}$ /cc, so that the minority carrier injection occurs mainly in active lateral base region 25 where the base impurity concentration is much lower than in the vertical base region 19.

Since in this case, the active base width, that is the length of the base region in the lateral direction, is regulated by heat-treatment after RED, there is no need to consider the vertical width and therefore it is sufficient to note only the lateral width because the impurities are extended deeply by the RED to a certain constant level in the vertical direction. This is a significant advantage in fabricating design.

Furthermore, since the main lateral base region 25 is formed by the double-diffusion of the base and the emitter starting from the same single diffusion hole formed by a single photo-etching, (that is, starting from the same diffusion boundary) the advantage of determining the active base width by the difference between diffused lengths of the base and emitter is obtainable as in the conventional method. There is the additional advantage that the length of the internal base resistance portion lying in the direction of base current flow can be reduced down to the order of sub-microns because the vertical length corresponding to the internal base resistance is determined by the depth of the emitter diffusion. Since it is easily possible to limit the base width to 0.5 microns or less, in practice, a lateral transistor whose maximum oscillation frequency is more than several GHz can be easily fabricated. Furthermore, since there is hardly any minority injection in the base region 19 extending in the vertical direction due to the high concentration of base impurity thereof and since it is further connected to the $p^+$ base contact, a substantial reduction in the base resistance can be obtained. The external base resistance is determined by this resistance of the $p^+$ layer 19. Since it is possible to raise the concentration of impurity of this base portion under the emitter sufficiently, regardless of the other structures, and to increase the thickness thereof, it is very easily possible to design the transistor such that external base resistance is reduced by a desired amount.

Figure 24:
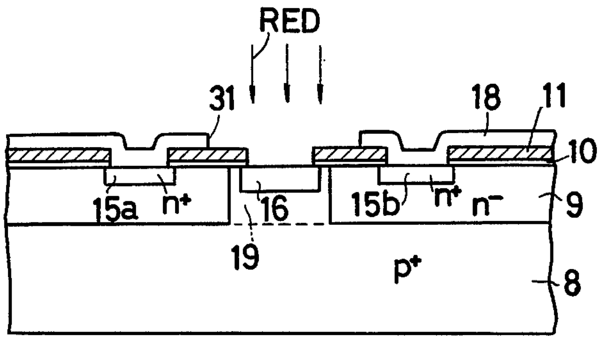
Figure 25:
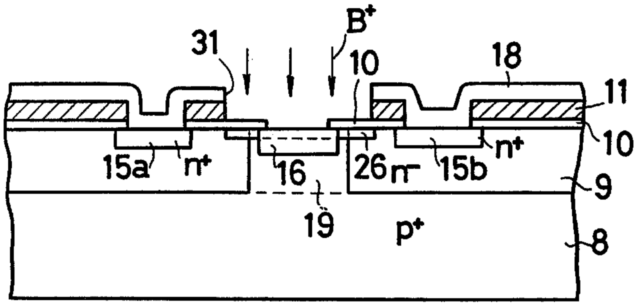
Figure 26:
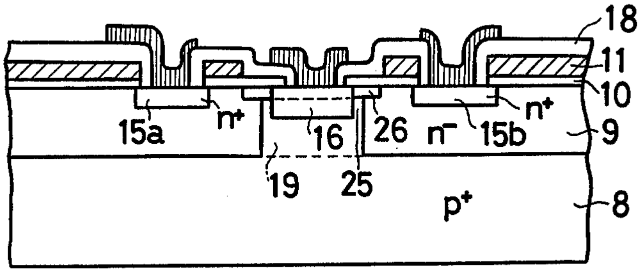

In the embodiments shown in FIGS. 6–11 and 12–23 and described above, there is a possibility of the surface electric potential becoming unstable because the active portion of the lateral transistor is very near the surface and in order to avoid this possibility a structure having a silicon gate 13 is employed. FIGS. 24–26 show another embodiment which is not subject to the effect of surface potential, without the provision of such silicon gate.

A structure ultimately obtained in this embodiment is shown in FIG. 26 in which a thin portion 26 having a high density of the order of $5 \times 10^{18}$ /cc is produced on the surface of the active base region 25. With this structure it is possible to avoid propagation of surface potential into lateral base portions existing below the portion 26 due to the high base impurity concentration thereof. In this case, the base region 25, except for the portion 26 thereof, acts as the active lateral internal base region and, similarly to region 19, there is hardly minority carrier injection from emitter thereto due to the high base impurity concentration thereof.

In order to fabricate the structure such as shown in FIG. 26, the structure shown in FIG. 24 is first produced in the same manner as the aforementioned embodiment shown in FIGS. 6–10 except for the provision of the silicon gates 13a and 13b. In the structure shown in FIG. 24, a mask 18 of thick $SiO_2$ is provided. Subsequently RED is performed through the mask 18 of $SiO_2$ and heat-treatment is performed therefor.

Then, as shown in FIG. 25, the insulating film 11 of $Al_2O_3$ within the mask hole of 18 is selectively etched out using the $SiO_2$ mask 18 as it is and employing an etchant such as heated phosphoric acid. Through the hole 31 formed by this etching, $B^+$ ions are implanted in the direction shown by the arrows in the same figure to introduce the ions and to thereby form the portion 26. Since in this case, the thickness of the $SiO_2$ layer 10 lying below the insulating film 11 of $Al_2O_3$ is small enough to permit the penetration of the ions so that the existence of the $SiO_2$ layer 10 does not effect to the formation of the portion 26 adversely.

Figure 27:
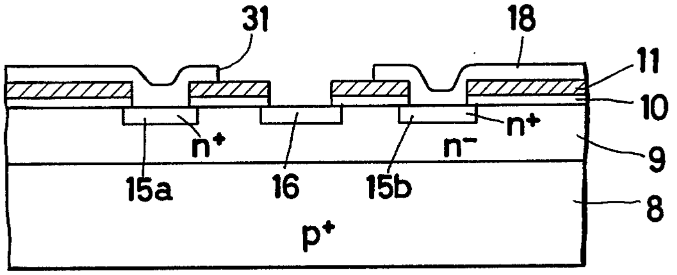
Figure 28:
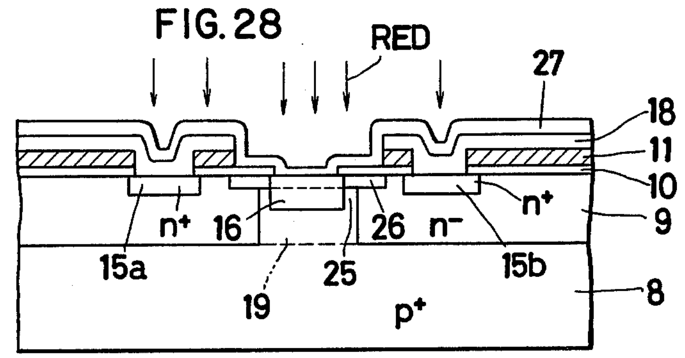
Figure 29:
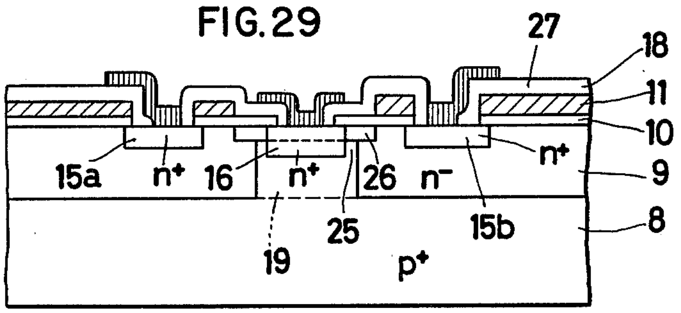

FIGS. 27–29 show another embodiment suitable for fabricating the final structure shown in FIG. 26 etc.

The structure shown in FIG. 27 is obtained in the same manner described with respect to FIG. 24 except that the mask 18 of thick $SiO_2$ is formed by the CVD method, and then the insulating film 11 of $Al_2O_3$ around the emitter 16 is also etched out by using heated phosphoric acid as etchant.

Thereafter, as shown in FIG. 28, a boron doped oxide layer 27 is attached and then the RED method is performed with $H^+$ or $He^+$ ions at the substrate temperature of 700°–900°C. In this manner, a $P^+$ region 26 and an external base region 19 in contact with the $P^+$ substrate 8 are formed simultaneously by RED and heat-treatment due to the difference in RED range inside and outside the thin $SiO_2$ layer 10, and thus a structure such as shown in FIG. 29 can be obtained.

As described with respect to the preferred embodiments, the present invention makes it possible to reduce both the base width and the internal base resistance of a transistor, a feat which has heretofore been considered self-contradictory and impossible. The invention attains its object by performing double diffusion in the lateral direction for the emitter and base starting from the same diffusion boundary with the same photo-etching hole and by utilizing a $P^+$ base layer in the vertical direction produced by RED. According to the present invention, ultra-high frequency laternal-transistors can be easily fabricated with good freedom of design.

Furthermore, according to the present method, particularly the methods shown in FIGS. 24–26 and 27–29, it is easily possible to fabricate a lateral transistor of a structure which in operation prevents the effects of surface potential and conseuqently makes possible higher frequency application and denser concentration of integrated circuits.

What is claimed is:

1. A method for fabricating an ultra-high frequency lateral transistor which comprises:
   A. attaching a thermally oxidized $SiO_2$ layer having a thickness of 200 – 500 A on an epitaxial $N^-$ layer provided on one surface of a substrate;
   B. attaching an insulating film of $Al_2O_3$ on the $SiO_2$ layer;
   c. etching holes by means of a mask into the $SiO_2$ layer and to the epitaxial layer;
   D. forming a collector and an emitter in the epitaxial layer by $N^+$ diffusion;
   E. masking areas of the surface of the layered substrate while leaving the emitter exposed;
   F. forming a shallow diffusion region on the emitter; and
   G. irradiating the substrate with ions having an acceleration voltage of about 80 – 150 KV while the substrate is heated at a temperature of 600° – 900°C. whereby base impurity is introduced into the substrate through the hole used to form the emitter.

2. The method of claim 1 wherein after Step B, and prior to Step C, further steps include attaching by CVD a silicon gate layer onto the insulating film of $Al_2O_3$, removing by photoetching portions of the silicon gate layer while leaving silicon gate portions, and applying by CVD an insulating film of $SiO_2$ onto the photoetched and silicon gate portions.

3. The method of claim 1 wherein after Step G, further steps include selectively etching a further portion of the $SiO_2$ layer, and implanting $B^+$ions to the etched portion of the $SiO_2$ layer to form a thin portion of high density on the surface of the epitaxial layer adjacent the emitter.

4. The method of claim 1 wherein the impurity density of the material forming the epitaxial layer of the substrate is $10^{14}$–$10^{17}$/cc.

5. The method of claim 1 wherein the impurity density of the material forming the epitaxial layer of the substrate is $\pi$-type which is the same conductivity type of the base region.

6. A method for fabricating an ultra-high frequency lateral transistor which comprises:
   A. attaching an $SiO_2$ layer of diffusion of base contact onto a substrate;
   B. photo-etching a hole into the $SiO_2$ layer for diffusion of the base contact;
   C. producing a base contact by diffusion of boron from a $P^+$ diffused region;
   D. removing the $SiO_2$ layer by etching;
   E. applying a thin $SiO_2$ film onto the etched surface;
   F. applying an insulating film of $Al_2O_3$ onto the thin $SiO_2$ film;
   G. applying by CVD an insulating film of $SiO_2$ onto the $Al_2O_3$ layer;
   H. etching holes by means of a mask into the $SiO_2-Al_2O_3-SiO_2$ layers to the substrate layer;
   I. forming a collector and an emitter in the substrate layer by $N^+$ diffusion;
   J. masking areas of the surface of the layered substrate while leaving the emitter exposed;
   K. forming a shallow diffusion region on the emitter; and
   L. irradiating the substrate with ions having an acceleration voltage of about 80 – 150 KV while the substrate is heated at a temperature of 600° – 900°C. whereby base impurity is introduced into the substrate through the hole used to form the emitter.

7. The method of claim 6 wherein Step F and prior to Step G, further steps include applying a silicon gate layer onto the insulating film of $Al_2O_3$, and removing by photo-etching portions of the silicon gate layer while leaving silicon gate portions, the position of the silicon gate portions being horizontally spaced from the base contact.

8. The method of claim 6 wherein after Step L further steps include selectively etching a further portion of the $SiO_2$ layer, and implanting $B^+$ ions to the etched portion of the $SiO_2$ layer to form a thin portion of high density on the surface of the epitaxial layer adjacent the emitter.

9. The method of claim 6 wherein the diffusion region of Step K is formed by $P^+$ diffusion.

10. The method of claim 6 wherein the diffusion region of Step K is formed by boron diffusion.

11. The method of claim 10 wherein the base impurity is supplied using boron doped oxide.

* * * * *